United States Patent [19]

Godejahn, Jr. et al.

[11] 4,221,044
[45] Sep. 9, 1980

[54] SELF-ALIGNMENT OF GATE CONTACTS AT LOCAL OR REMOTE SITES

[75] Inventors: Gordon C. Godejahn, Jr., Santa Ana; Gary L. Heimbigner, Anaheim, both of Calif.

[73] Assignee: Rockwell International Corporation, El Segundo, Calif.

[21] Appl. No.: 913,182

[22] Filed: Jun. 6, 1978

[51] Int. Cl.² ............................................. B01J 17/00
[52] U.S. Cl. .................................. 29/571; 29/577 R; 29/578; 29/589
[58] Field of Search ................ 29/571, 577, 578, 589, 29/590, 591; 357/59

[56] References Cited
U.S. PATENT DOCUMENTS 4,124,934  11/1978  DeBrebisson ......................... 357/59

Primary Examiner—W. C. Tupman
Attorney, Agent, or Firm—H. Fredrick Hamann; Harry John Staas

[57] ABSTRACT

A process for producing VLSI (very large scale integrated) circuits employs techniques of self-aligned gates and contacts for FET devices and for both diffused conducting lines in the substrate and polysilicon conducting lines situated on isolating field oxide formed on the substrate. Mask alignment tolerances are increased and rendered non-critical. The use of materials in successive layers having different etch characteristics permits selective oxidation of only desired portions of the structure without need for masking and removal of selected material from desired locations by batch removal processes again without use of masking. There results VLSI circuits having increased density and reliabilty. The process allows the simultaneous doping of two or more regions resulting in uniformity of device characteristics.

26 Claims, 19 Drawing Figures

SELF-ALIGNMENT OF GATE CONTACTS AT LOCAL OR REMOTE SITES

BACKGROUND OF THE INVENTION

1. Field of the Invention

The invention relates to the field of semiconductor device fabrication techniques and more particularly to the field of fabrication techniques for the fabrication of very large scale integrated circuits (VLSI) having increased density and reliability and containing FET devices, polysilicon and diffused N+ interconnect lines, and metallized interconnect lines interfacing with the polysilicon and N+ diffused lines.

2. Prior Art

The semiconductor art has been concerned with reducing the size and power consumption of individual devices and intergrated circuits in order to increase the logic power of these circuits per unit area. A particular effort has been extended in the area of monolithic random access memories (RAM's) and read only memories (ROM's) having very large memory capacity. Many things have been done over the years in an attempt to reduce the size of devices and improve tolerances with which they are fabricated. Such efforts have included, inter alia, fine line lithography, improved mask generation and alignment machines, improved tolerances on mask alignment, and self-aligned gates. These techniques have reduced the area required for the fabrication of the individual FET devices used in these intergrated circuits. However, because of alignment tolerances, the FET devices must be designed with larger geometry than they would have to be if perfect mask alignment were obtained. Furthermore, because of alignment tolerances, the FET devices must be spaced further apart than otherwise necessary in order to allow for the misalignment in the formation of the interconnection lines. Consequently, there is a need for an improved integrated circuit fabrication technique for producing VLSI circuits including FET devices and conducting lines having reduced sensitivity to mask alignment.

SUMMARY OF THE INVENTION

In a process in accordance with the invention, both the gate oxide layer of the active FET devices of the integrated circuit as well as a silicon nitride layer are formed on the surface of a silicon substrate. Both layers are surrounded by a field oxide layer and simultaneously formed on areas in which diffused N+ conducting lines are to be formed. A polysilicon layer formed on the nitride layer, is delineated to provide the polysilicon conductor of the gates of the FET devices as well as being delineated for additional interconnection lines and then may be partially oxidized in reliance on the masking effect of the nitride layer. This affords minimal oxide layer thickness on the gate polysilicon layer and again contributes to the reduced device size. Subsequently, silicon nitride, silicon oxynitride, silicon dioxide, and photoresist layers are then employed in various masking and selective etch processes to provide self-aligned gates and contacts for FET devices and self-aligned interconnection interfaces. The fact that silicon nitride, silicon oxynitride, silicon dioxide, photoresist, and silicon all have different etch removal rates when exposed to various etching processes makes it feasible for the number of masking steps to be reduced in comparison to prior art methods and further allows self-alignment features not previously obtainable. In addition, the method described below in accordance with the present invention allows the simultaneous doping of two or more regions. This is advantagous in that the resulting integrated circuit device has more uniform characteristics.

The processes of the present invention permit direct contact to the gate electrode as well as floating gate contact configurations. Diffused conducting lines permit a first level interconnect to source and drain as well as being compatable with a direct gate contact configuration. Conversely a remote gate contact with direct source and drain contacts may also be afforded. Theoretically, simultaneous and direct source, gate, and drain contacts may be provided although current technology limits the miniaturization of device size and configuration by virtue of the dimensions of the conducting lines in such a simultaneous direct contact device configuration.

These and other objects and advantages of the invention will be apparent from the following detailed description of certain preferred embodiments thereof.

DESCRIPTION OF THE PREFERRED EMBODIMENTS

First Preferred Embodiment

Figure 2:
FIGS. 2–17 illustrate partial plan and cross-sectional views of the semiconductor wafer illustrated in FIG. 1. These figures illustrate in chronological order the semiconductor wafer after having undergone the various steps enumerated below.

The following description of the first preferred embodiment provides the chronological sequence of process steps performed in accordance with the present invention. Each of these process steps has been given a numerical designation for ease of identification. having a monocrystalline device quality layer of P-type silicon. The wafer can be either of monolithic configuration or may be a composite wafer having a silicon layer 1 on top of a substrate of different material (e.g., silicon-on-sapphire composite). In addition, while the process has been illustrated as beginning with a P-type substrate it is of course understood that the process is amenable to N-type substrates as well. The dopant materials used in such a case would be different from those indicated below. The wafer is first cleaned by conventional means to remove the normal surface impurities. FIG. 2 illustrates a partial cross-sectional view of a monolithic silicon wafer 1.

Figure 3:
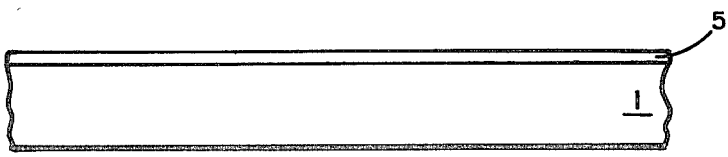

Step 2. The now cleaned wafer is subjected to a conventional oxidation process (e.g., thermal oxidation) which serves to form a silicon dioxide layer 5 on top of the silicon layer 1. A typical thickness for the silicon dioxide layer 5 would be somewhere on the order of 600 Å. FIG. 3 illustrates a partial cross-sectional view of the wafer after having been processed in accordance with this step.

Step 3a. A first nitride layer 6 is deposited on top of the silicon dioxide layer 5 using conventional nitride deposition techniques. The nitride layer 6 deposited may typically be on the order of 575 Å thick.

Figure 4:
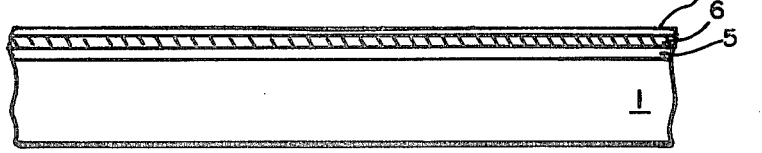

Step 3b. The wafer is then optionally subjected to a short steam cycle to form a thin silicon oxynitride layer 400 on top of the silicon nitride layer 6. This oxynitride layer 400 allows for greater adherence of the photoresist regions 100 and 101 applied in step 4a below. However, it has been found that this oxynitride layer is not absolutely necessary. FIG. 4 illustrates the wafer after being processed in accordance with step 3b.

Figure 1:
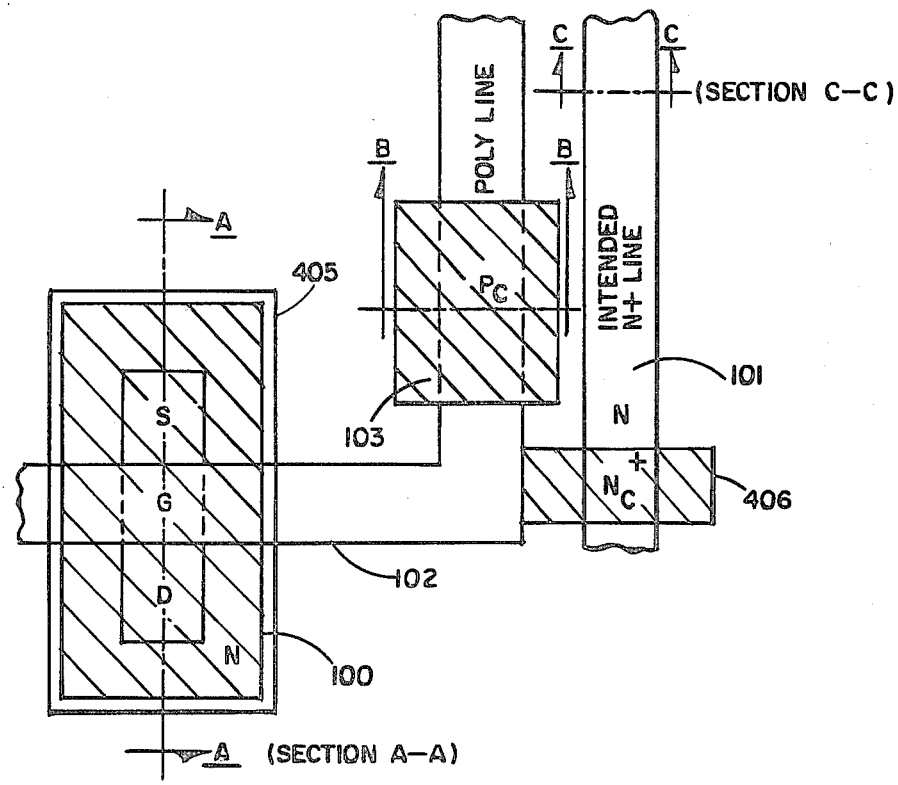
FIG. 1 illustrates a partial plan view of the surface of the semiconductor wafer to be processed in accordance with the present invention. The cross-hatched portions correspond to the various photolithographic masks used in performing the process in accordance with the present invention. Section lines A—A, B—B and C—C are provided so as to reference FIGS. 2 through 11, 13, and 15–17.

Step 4a. A photoresist layer is then deposited on top of the silicon nitride and oxynitride layers and this photoresist layer is exposed to actinic radiation through a N-mask. The N-mask is substantially transparent to actinic radiation except for a plurality of protective regions (i.e. - 100 and 101 as illustrated in FIG. 1) which are opaque to the actinic radiation. The photoresist regions 100 and 101 which have been shielded by the opaque protective regions of the N-mask are nonsoluble in an appropriate photoresist developer while the remainder of the photoresist which had been exposed to the actinic radiation becomes soluble in the same appropriate photoresist developer. Thus, by placing the wafer in an appropriate developer solution, the photoresist layer is selectively removed in accordance with the configuration of the protective regions 100 and 101 of the N-mask.

Step 4b. The wafer is then subjected to sequential selective oxynitride and nitride removal processes using removal processes that attack the oxynitride layer 400 and the nitride layer 6 but do not attack the photoresist layer. Thus, the oxynitride layer 400 and the nitride layer 6 are selectively removed from the entire surface of the silicon dioxide layer at all regions except where protected by the remaining regions 100 and 101 of the photoresist layer. A plasma etching process is but one example of such a selective nitride removal process. The remaining oxynitride and nitride regions cover those areas of the wafer in which the FET devices will be located (i.e.—region 100) and further cover the areas of the chip in which N+ diffused interconnecting lines will eventually be formed (i.e.—region 101).

Figure 5:
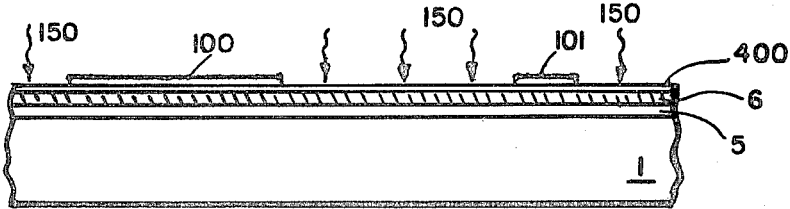

FIGS. 1 and 5 illustrate the two photoresist layer regions 100 and 101 which the N mask has protected.

Figure 6:
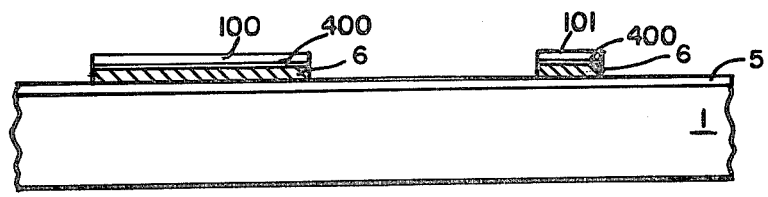

Step 5. The wafer is then subjected to a dopant implant step in which dopant ions (e.g.—boron ions) are implanted into the surface of the entire silicon layer except for those areas directly underneath the remaining photoresist regions 100 and 101. The photoresist layer is a shield against the dopant ions. The arrows 150, in FIG. 5, indicate the path of the dopant ions. After the ion implantation step, the photoresist regions 100 and 101 are removed by conventional techniques (e.g., sulphuric/persulfate acid bath). The ion implantation serves to dope the silicon substrate 1 in those regions which will ultimately be used for isolating the active devices and the N+ interconnecting lines. FIG. 6 illustrates the wafer after being processed in accordance with this step.

Step 6. The wafer is then subjected to an annealing process which serves to stabilize and equalize the above noted ion implantation step. This annealing step may be combined with the field oxidation step (step 7) described below.

Figure 7:
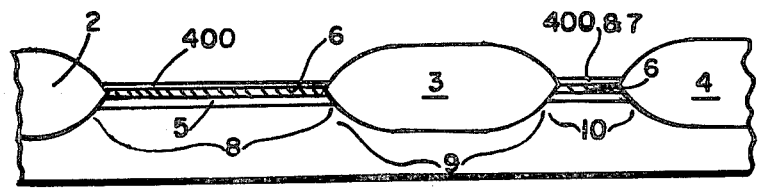

Step 7. The wafer is then subjected to a thermal field oxidation process which thermally oxidizes the surface of the field portions of the silicon layer 1 except under the remaining portions of the silicon oxynitride and nitride layers 400 and 6. The silicon nitride layer portions 6 serve to protect the underlying silicon from thermal oxidation. Typically, the thermal oxidation process can be used to form silicon dioxide layers 2, 3, and 4 having a thickness on the order 15,500 Å. In addition, such a thermal oxidation process of sufficient duration to produce a 15,500 Å silicon dioxide thickness will produce an oxynitride layer 7 having a 200 Å thickness. The oxynitride layer 7 combines with the optional oxynitride layer 400 to form a single oxynitride layer. This single combined layer will subsequently be referred to as oxynitride layer 400 for convenience. The thermally grown silicon dioxide field oxide layers 2, 3, and 4 will ultimately serve to electrically isolate the FET devides and N+ diffused interconnections. FIG. 7 illustrates a cross-sectional view of the semiconductor wafer illustrated in FIG. 1 after having undergone processing steps 1 through 7. Note that the thick field oxide regions 2, 3, and 4 have been grown everywhere but in regions 8 and 10. Region 8 illustrates the cross-section taken along section line A—A of FIG. 1 while area 9 illustrates a cross-section taken along section line B—B of FIG. 1. Area 10 is a cross-sectional view taken along section line C—C of FIG. 1. In areas 8 and 10, the silicon substrate 1 is covered by the gate oxide layer 5, the silicon nitride layer 6, and the oxynitride layer 400. Present but not shown in FIG. 7 are the regions of silicon layer 1 underneath the field oxide layer 2, 3, and 4 which have dopant ions which have been implanted by step 5. While the process indicates the use of a nitride layer, it is understood that other materials having characteristics similar to silicon nitride may be substituted.

Step 8. A layer of polycrystalline silicon (polysilicon) 11 is then deposited on top of the surface of the wafer. Typically, a phosphorus or arsenic doped polysilicon is used and a polysilicon layer 11 having a thickness on the order of 8,000 Å is deposited. The polysilicon layer 11 will eventually be delineated so as to form the gate electrodes and remote gate interconnect lines. While polysilicon is indicated as the appropriate material for this process, it is understood that others have experimented with the use of various metals (e.g.—molybdenum) as a substitute material for polysilicon in such applications.

Step 9. The polysilicon layer 11 is then oxidized using conventional oxidation techniques (e.g., steam treatment) to form a layer of silicon dioxide 12 on top of the polysilicon layer 11. Typically, a silicon dioxide layer 12 of between 600 to 1,200 Å is formed.

Figure 8:
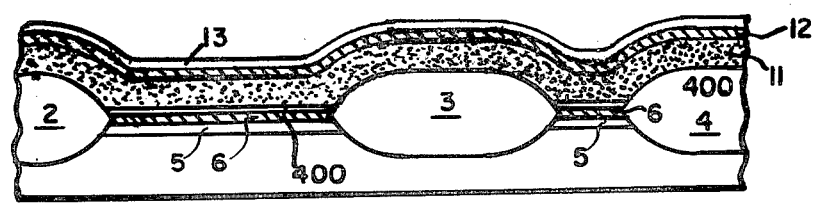

Step 10. The wafer is then subjected to a second nitride deposition process which deposits a layer of silicon nitride 13 on top of the silicon dioxide layer 12. Typically, this second nitride layer 13 is on the order of 400 Å thick. FIG. 8 illustrates the wafer after being processed in accordance with step 10.

Step 11. A layer of photoresist is then applied on top of the second nitride layer is and exposed to actinic radiation through a PC-mask. This mask has its opaque protective regions 103, illustrated in FIG. 1, configured so as to render the photoresist layer nonsoluble at that region on the wafer wherein the polysilicon contact to a subsequently formed metalized interconnect line is to be located. The photoresist layer is then developed with the appropriate photoresist developer solution to remove the unwanted photoresist layer.

Step 12a. The wafer is then subjected to a selective nitride layer removal process (e.g. plasma etching) to selectively remove all of the second nitride layer 13 except those portions protected by the remaining photoresist layer 401.

Figure 9:
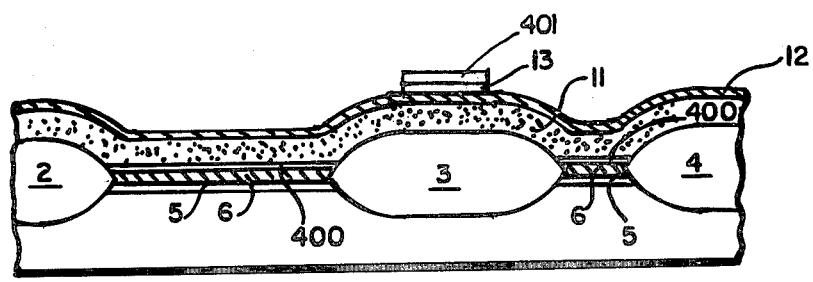

FIG. 9 illustrates a cross-sectional view of a semiconductor wafer 1 of FIG. 1 after having undergone processing up to and including step 12a in accordance with the present invention. The polysilicon layer 11 is covered at the PC contact site by a silicon dioxide layer 12, the second silicon nitride layer 13, and the photoresist region 401 which covers the illustrated polysilicon contact.

Step 12b. The remaining photoresist layer 401 is then removed. Thus, the PC contact area is protected by the second nitride layer 13, while the remainder of the wafer has a surface layer of silicon dioxide 12.

Step 13. Apply a layer of material such as boron doped chemically vapor deposited silicon dioxide (Silox) which has a lower etch rate than oxynitride layers when exposed to the same etchants. Other substitute materials may be used.

Figure 10:
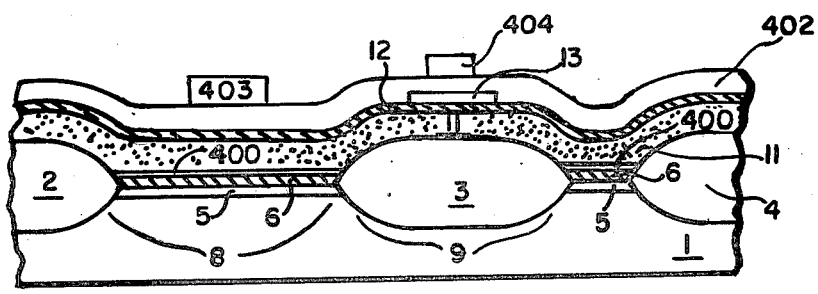

Step 14a. Apply a layer of photoresist 14 to the silicon wafer and exose same to actinic radiation through a G-mask and then remove the unwanted photoresist layer using the appropriate developer solution. This leaves regions of photoresist 14 atop the exposed Silox layer 402 atop the second nitride layer 13 and silicon dioxide layer 12 at those locations where the polysilicon interconnect and polysilicon gate lines are located (illustrated as area 102 in FIG. 1). FIG. 10 illustrates a partial cross-sectional view of the wafer after being processed in accordance with step 14. Note that the G-mask resist areas 403 and 404 are juxtaposed directly above the gate and polysilicon line regions. Also note that as illustrated in FIG. 1, because of the fact that the PC mask and N mask regions 103 and 100 are larger than the polysilicon line and gate mask 102, the alignment tolerance of the G mask is not stringent.

Step 15a. Using a selective oxide removal process, selectively remove those portions of the Silox layer 402 not protected by the G-mask resist regions 403 and 404.

Step 15b. Using a selective nitride removal process (e.g., plasma etch), selectively remove those portions of the second silicon nitride layer 13 not protected by the photoresist regions 403 and 404.

Step 15c. Using a selective oxide removal process, selectively remove those portions of the silicon dioxide layer 12 not protected by the G-mask resist regions 403 and 404.

Figure 11:
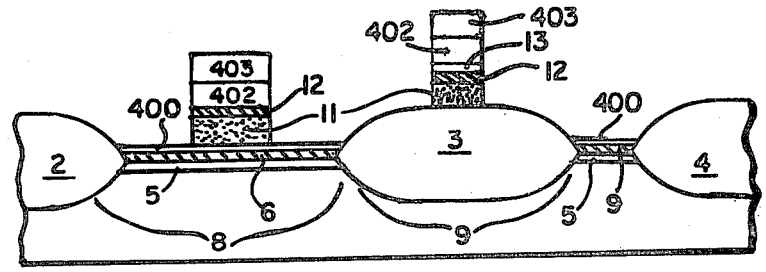

Step 15d. Using a selective polysilicon removal process, selectively remove those portions of the polysilicon layer 11 not protected by the photoresist regions 403 and 404. FIG. 11 illustrates a partial cross-sectional view of the wafer after having undergone processing in accordance with step 15d. Note that the G-mask region in area 8 (i.e.—the gate region) comprises the silicon 1, covered by silicon dioxide 5, silicon nitride 6, and silicon oxynitride 400, covered in turn by polysilicon 11, silicon dioxide 12, Silox 402, and finally covered by the G-mask resist region 403. The G-mask region in area 9 (i.e.—the PC polysilicon contact region) consists of the silicon 1 covered by the field oxide 3, covered by polysilicon 11, silicon dioxide 12, covered in turn by the second nitride layer 13, the Silox 402, and finally covered by the G-mask resist region 404. The source, drain, and N+ diffused line areas consist of the silicon 1 covered by silicon dioxide 5, silicon nitride 6, and silicon oxynitride 400.

Step 15e. Remove the remaining portions of the photoresist layer using conventional techniques.

Figure 12:
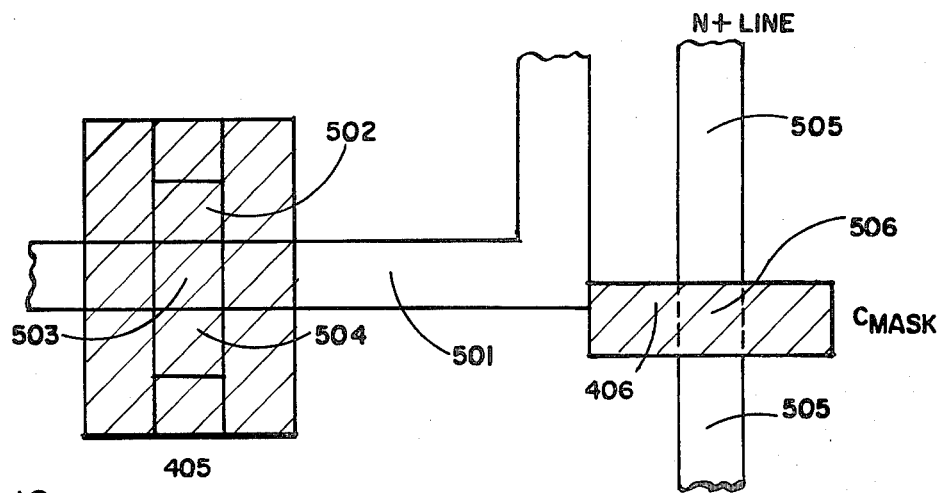

Step 16. Apply a layer of photoresist to the silicon wafer and expose same to actinic radiation through a C-mask and then remove the unwanted photoresist layer using the appropriate developer solution. This leaves a layer of photoresist atop the wafer at those regions shown in crosshatch lines as regions 405 and 406 of FIG. 12. Areas 501–506 respectively illustrate the polysilicon line 501, source 502, gate 503, and drain 504 of an FET device, N+ diffused line 505 and N+ contact 506. These regions are over areas which will ultimately be the contact interface between the source and drain lines, (i.e.—region 405) the diffused N+ lines (i.e.—region 406) and the subsequently formed metalized interconnection lines. As illustrated in FIG. 1, and C mask areas 405 and 406 do not require stringent placement alignment tolerances, since they are larger than the areas to be protected.

Step 17a. Using a selective oxynitride removal process, selectively remove those portions of the oxynitride layer not protected by the photoresist regions 405 and 406.

Step 17b1. Using a selective nitride removal process, selectively remove those portions of the nitride layer not protected by the photoresist regions 405 and 406.

Step 17b2. Remove the underlying oxide exposed by the nitride removal process in step 17b1.

Step 17b3. Deposit a phosphorus or arsenic dopant on the surface of the wafer and perform a dopant drive process to dope the N+ line.

Step 17c. Remove the photoresist regions 405 and 406 using conventional techniques.

Figure 13:
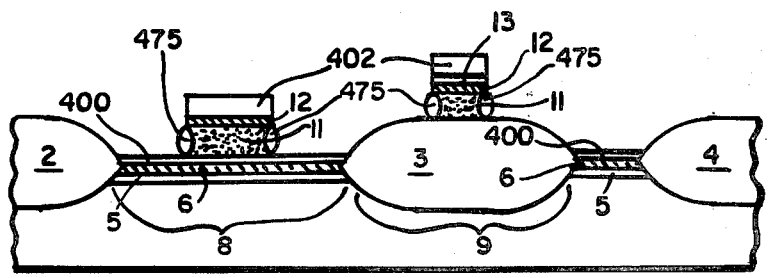

Step 17d1. Oxidize the exposed polysilicon interconnect line and N+ interconnect line using conventional oxidization techniques (e.g., steam processing) to fabricate a thick silicon dioxide layer 15 thereon. Typically, a 4000 to 5000 Å thick layer may be produced. It is important to note that in region 8 and in the region protected in the earlier steps by photoresist region 406, the oxynitride 400 and underlying nitride layer 6 protect the underlying source, drain and N+ contact areas from oxidation. Note that the sides of the polysilicon gate and line, not protected by a silicon nitride or oxynitride layer, are oxidized simultaneously with the formation of oxide layer 15. These additional oxidized side areas 475 are extremely important since their presence prevents the subsequently applied metalized interconnections to the source, drain, and N+ contacts, from shorting to the sides of the polysilicon gate and line if misalignment should occur. The oxidation process also partially oxidizes the top of polysilicon layer 11 not protected by the second silicon nitride layer. FIG. 13 illustrates dopant ions present in the Silox layer 402. FIG. 13 illustrates the wafer cross-section after being processed in accordance with step 17.

Figure 14:
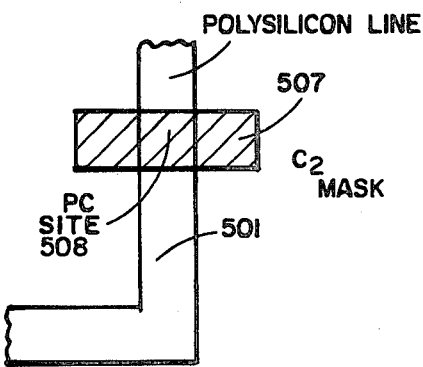

Step 18. Subject the wafer to a dip etch process to remove all of the exposed Silox layer 402. Alternatively, (see Alternate step 18 below) the wafer can be subjected to a C$_2$-mask step to leave a Silox layer covering the poly line except at the PC poly line contact site. FIG. 14 illustrates such a C$_2$-mask. The use of the C$_2$ mask step, as described below in Alternate step 18, leaves the Silox layer 402 covering the polysilicon line except at the PC contact site. Because of the presence of the Silox layer, the polysilicon line would not be doped by step 20. However, additional doping of the already doped polysilicon may not be required. For the remaining discussion, it will be assumed that step 18 has been performed instead of Alternate step 18.

Alternate Step 18. A photoresist layer is applied to the surface of the wafer and exposed to actinic radiation through a C$_2$-mask and the unwanted portions of the photoresist layer are then removed using an appropriate developer solution. The C$_2$-mask contains opaque protective regions so as to leave a photoresist layer over the entire surface except at those areas in which polysilicon line contacts are to be formed. The exposed Silox layer 402 is then removed and the C$_2$—mask photoresist layer removed, leaving a N+ contact area protected by a nitride/oxynitride button. Step 19a. Subject the wafer to a selective oxynitride removal process (e.g., wet or plasma etching) to selectively remove the exposed oxynitride layer off of the source, drain, and N+ line contacts located under the oxynitride layer.

Figure 15:
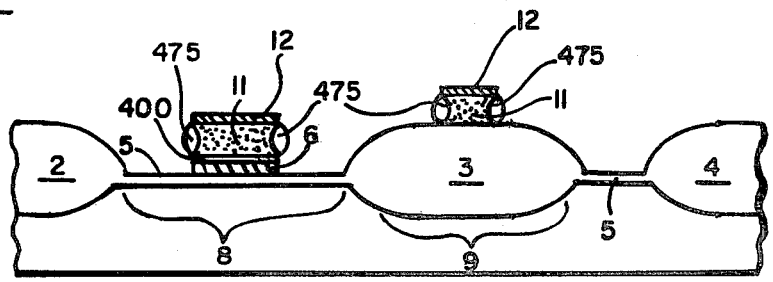

Step 19b. Subject the wafer to a nitride removal process (e.g., plasma or wet etching) to selectively remove those portions of the first nitride layer covering the source, drain, N+ line contacts and polysilicon line contact sites. FIG. 15 illustrates a cross-sectional view of the silicon wafer 1 after having undergone the nitride removal process of step 19b. Note that the source, drain, polysilicon contact and N+ contact now all have just a thin oxide layer cover. Dip etch the wafer to remove the oxide layer covering the regions to be doped.

Step 20. Deposit a layer of phosphorus using, for example, conventional POCl$_3$ techniques or deposit arsenic using a layer of arsenic doped Silox or polysilicon. Using conventional techniques, the wafer is then subjected to a doping process which drives the phosphorus or arsenic ions simultaneously into the source, drain, N+ contact and polysilicon contact regions.

Figure 16:
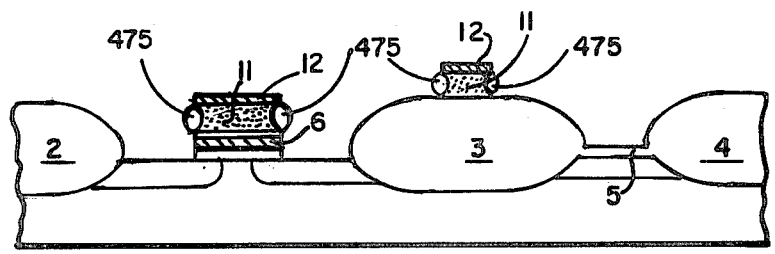

Step 21. Deglaze if a conventional POCl$_3$ doping procedure is performed, by a dip (batch) etching procedure. This dip etching serves also to remove any thin oxide layer covering the contact sites formed in step 20. FIG. 16 is a partial cross-sectional view of the wafer after having been processed in accordance with step 21.

Step 22. Apply a Silox layer 410 to the surface of the wafer and densify by normal densification techniques. Then apply a layer of photoresist and expose same to actinic radiation through a second C-mask and then remove the unwanted photoresist layer using the appropriate developer solution. The second C-mask has opaque portions arranged so as to leave unprotected the previously formed contact sites. The wafer is then subjected to a selective oxide removal process (e.g., etching) so as to provide windows into the contact sites. Note that the oxide removal process may be used to etch a window through both the Silox layer 410 and any remaining portions of the silicon dioxide layer 5. The second C-mask does not require stringent alignment tolerances since all the contact regions have already been formed and are separated by insulating materials, and since all of the edges 475 of the polysilicon line 11 are protected by an insulating oxide.

Step 23. Apply a metallization layer 20 and a photoresist layer and expose same to actinic radiation through a M-mask and then remove the unwanted photoresist layer using standard removal techniques. The M-mask is arranged to leave protective portions of photoresist layer on those areas of the conductive metalization layer wherein interconnections to the contacts are to be formed. The wafer is then subjected to a standard metalization layer removal process (e.g., etching) to remove the unwanted metalization layer and the wafer is then subjected to a photoresist removal process. Other materials (e.g.—polysilicon) could be substituted for the metalization layer 20.

Figure 17:
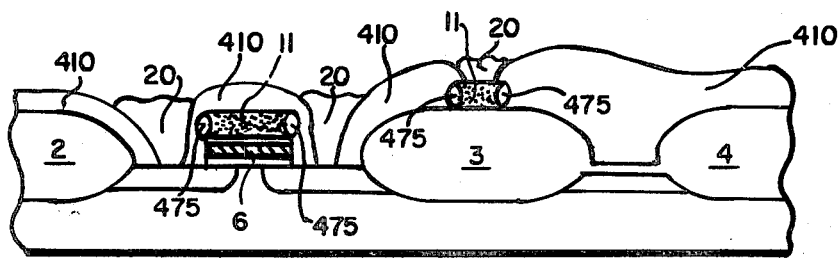

Step 24. The wafer is then exposed to a hydrogen annealing process to anneal the previously formed metalization layer. FIG. 17 illustrates the silicon wafer of FIG. 1 after this step.

Step 25. The wafer is then subjected to the usual finishing procedures (e.g., sandblasting, cleaning, passivating) in accordance with conventional procedures.

Alternate Embodiment I

This embodiment is essentially a modification of the first embodiment described above with the distinction being that the boron doped Silox deposition step (Step 13) is replaced by the boron doping of an oxynitride layer (greater than 80 Å thick) formed over the second silicon nitride film. In other words, after Step 10 of the first embodiment, we would add:

Step 10a. Steam nitride layer to form an oxynitride layer thereon.

Step 10b. Subject the wafer to a boron deposition process (e.g., boron deposition at 1030° with BB$_{r3}$) to deposit boron ions on the just formed oxynitride layer.

Step 13 of course would be deleted and in Steps 15a and 18 we would of course selectively etch the boron doped oxynitride layer rather than a Silox layer. The remaining processing steps would be identical to those of the first embodiment.

Alternate Embodiment II

This embodiment is an improvement over the embodiments described above in that a layer of silicon nitride is used instead of the boron doped Silox or boron doped oxynitride layers. Since the silicon nitride layer (designated silicon nitride III) may be as thin as 400Å, one can more accurately etch the polysilicon lines then, for example, when using the Silox or nitride II layer which must be thicker typically than the silicon nitride layer. Since the processes of this embodiment are quite similar to those of the first embodiment, the different processes described below with regard to this embodiment will not be stated in such comprehensive detail as that provided for the first embodiment.

Step 1. Perform the steps of the first embodiment up to and including Step 10 (deposit silicon nitride layer II).

Step 2. Steam silicon nitride II layer to form a layer of silicon oxynitride (e.g.,—greater than 80Å thick).

Step 3. PC mask

Step 3a. Remove unwanted resist so as to leave resist on the PC mask as in first embodiment.

Step 3b. Etch the unprotected oxynitride layer.

Step 3c. Remove the exposed field nitride layer using, for example, a plasma etch process.

Step 4. Deposit a silicon nitride layer III (e.g., 400 Å thick), and steam the nitride layer to form a silicon oxynitride layer.

Step 5. G mask

Step 5a. Remove unwanted photoresist layer so as to leave resist over the PC stripe and over the polysilicon interconnection lines.

Step 5b. Etch the exposed oxynitride off of the field areas.

Step 5c. Etch the nitride off of the field using, for example, a plasma etch process so as to leave nitride covering the oxynitride strip on the PC pad and over the oxidized polysilicon interconnection lines.

Step 5d. Remove the remaining photoresist and etch the exposed oxide and polysilicon lines using, for example, wet or dry plasma etching techniques.

Step 6. C mask (as in first embodiment).

Step 6a. Remove unwanted photoresist so as to leave resist areas on the N+ diffused line contact region and the source and drain regions.

Step 6b. Using a selective removal procedure, (e.g.—selective etch) etch the oxynitride layer off of the N+ lines.

Step 6c. Remove the remaining photoresist layer using conventional methods.

Step 6d. Plasma etch the silicon nitride off of the N+ lines and the polysilicon lines and then dip etch the entire wafer to remove the underlying silicon dioxide layer so as to expose the bare silicon, thus exposing the N+ and polysilicon lines.

Step 7. Deposit arsenic or phosphorus using conventional techniques or alternatively implant arsenic or phosphorus ions using ion implant techniques. Deglaze the wafer if necessary.

Step 8. Drive the junctions in the N+ lines and oxidize the N+ lines and polysilicon lines to any desired oxide thickness. For example, if a 5,000 Å thick oxide layer is desired, a 90-120 minute steam process would be desirable for phosphorus type doping. A different cycle would be necessary for arsenic doping to achieve a similar result. Step 9. Dip etch the oxynitride layer off of the contact sites.

Step 10. Plasma etch the exposed nitride layer off of the contact sites.

Step 11. Phosphorus or arsenic dope the source, drain, N+ contacts and PC contacts as in the first embodiment. Note that in this embodiment, the N+ and polysilicon lines are doped in a separate step.

Step 12. Continue with Step 21 of the first embodiment and complete the processing of the wafer.

Alternate Embodiment III

As an extension of alternate embodiment II, the following improved variation is offered:

At Step 4 of alternate embodiment II, a photoresist layer can be substituted for the third silicon nitride layer and left in place after the G masking steps (Steps 5 and 5a of alternate embodiment II). After Step 5b of alternate embodiment II is completed, the oxynitride layer is removed, and the polysilicon layer plasma etched to delineate the polysilicon lines. The plasma etching method usually improves the resist adherence through perhaps an additional polymerization. This is a highly desirable feature, since in this alternate embodiment, the G mask resist is left in place as a protective covering for the polysilicon contact stripe PC of oxynitride coated nitride during the C layer etching step of the oxynitride layer over the N+ lines (i.e., the resist for the C layer is next applied over the resist remaining from the G layer masking steps. The processing then continues to Step 6b of alternate embodiment II and the oxynitride layer is etched off the N+ lines. Subsequently, in Step 6c the resist from both the C and the G masking operations is removed. Step 6d is then performed to plasma etch the first silicon nitride layer from the N+ lines. The wafer is then dip etched to remove the underlying oxide layer and the processing proceeds to Step 7 of alternate embodiment II and continues to completion of the wafer.

Alternate Embodiment IV

In order to reduce the deleterious effect of the first silicon nitride regions edge lifting and cracking after Step 7, (i.e., the field oxidation step of all the various embodiments), the first silicon nitride layer can be stripped by a plasma etching technique after the field oxidation, and then the wafer can be subjected to a wet etching to remove the underlying oxide layer. A new gate oxide and gate silicon nitride layer are then regrown. For example, the wafer is first processed in accordance with Steps 1 through 7 of the first embodiment. The wafer is then processed as follows:

Step 2a. Remove the oxynitride layer off the N mask regions by conventional etching techniques (e.g., wet acid etching).

Step 2b. Remove the exposed silicon nitride layer by conventional plasma etching techniques.

Step 2c. Remove the exposed underlying oxide layer if desired.

Step 2d. Subject the wafer to a reoxidation process to regrow the gate oxide to a thickness of about 600Å. It is noted that the removal of the underlying oxide (Step c) will preferentially attack the "bird beak" formed during the original field oxidation step and reduce its height and stress contributing factors. This preferential attacking of the "bird beak" oxide occurs because the "bird beak" oxide is more highly stressed. By reoxidizing the intended gate region and redepositing a silicon nitride layer, the resultant oxide/nitride sandwich layer has a better integrity and fewer defects. Furthermore, by regrowing the oxide and the depositing with silicon nitride, the field oxide regions are covered with an additional silicon nitride layer to provide additional isolation of the polysilicon lines and the field oxide. Furthermore, the silicon nitride layer atop the field oxide provides a different type of surface for nucleating the polysilicon layer to be applied later and usually produces a finer grained polysilicon texture.

Step 2e. Subject the wafer to a steam treatment to convert the exposed nitride film to an oxynitride. An added advantage of this newly formed silicon nitride layer is that it will prevent later oxide growth of the field regions during subsequent diffusion steps and act as an etch stop during later oxide etch steps. The wafer is then processed in accordance with the remaining steps of the various embodiments (i.e., deposit a layer of polysilicon as in Step 8).

Alternate Embodiment V

An improvement can be made in the above noted embodiments by the use of a doped chemically vapor deposited silicon dioxide layer (Silox). The Silox layer (doped either with phosphorus or arsenic for example) is used as a diffusion source for all of the N+ areas and enables the simultaneous diffusion of the source, drain, N+ lines, polysilicon lines, and polysilicon contacts. The doped Silox is left in place after the dopant diffusion process to serve as an electrical insulating layer. Particularly, it serves as an electrical insulator between the polysilicon lines and the metalized interconnection lines overlying the polysilicon lines. Another feature of this embodiment is the elimination of the first C masking step since a later C mask over the doped Silox layer will be used to open contacts to all of the desired contact regions. This C mask will have enlarged contact geometries, (for example, larger than the width of the polysilicon lines or N+ lines), to enable a non-stringent C mask positional alignment tolerance. Additionally, the polysilicon lines are oxidized to form for example 5,000 Å of silicon dioxide after the G masking step used to delineate the polysilicon lines but before the nitride layer is selectively removed from the N+ lines, source, drain, and polysilicon contacts. The basic sequence of masks used in this embodiment are: N, PC, G, C, and M. A short description of the sequence of steps in this embodiment is noted below:

Proceed to process the wafer in accordance with alternate embodiment IV as noted above up to an including the G mask process. After the photoresist layer has been exposed to the G layer mask to delineate the polysilicon lines, the wafer is dip etched to remove the oxynitride layer on the PC nitrided surface pad and the wafer is then subjected to a plasma etching process to remove the nitride extensions beyond the PC mask stripe.

The wafer is then subjected to a wet etching process to remove the field oxide layer on top of the poly layer and the wafer is then plasma etched to remove the polysilicon field. As an alternative to the plasma etching process, the remaining photoresist layer can be removed and the wafer subjected to a wet etching process to remove the polysilicon field.

The polysilicon lines are now delineated and after removing the remaining photoresist layer (if necessary) the polysilicon lines are oxidized to form a silicon dioxide layer thereon of typically between 3,000 and 5,000 Å thick.

The wafer is then subjected to a dip etching process to remove all of the oxynitride layer over the N+ lines. The oxynitride is also removed by the same process from the source and drain regions and the polysilicon contact sites.

The wafer is then subjected to a plasma etching process to remove the protective nitride I layer from the N+ lines, source, drain, and polysilicon contacts. Accordingly, the underlying oxide layer is dip etched. A layer of doped Silox (for example phosphorus doped) is then deposited and the wafer subjected to a drive process to simultaneously dope the source, drain, N+ lines, N+ contacts and polysilicon contacts.

A photoresist layer is then applied and exposed to actinic radiation through a C mask having typically enlarged contact geometries (perhaps with the exception of the PC stripe) on each side beyond the respective lines to be contacted. This allows for less stringent alignment tolerances.

After conventional photolithographic processing steps, the windows in the Silox are etched using conventional etching techniques.

An optional Silox reflow step may be performed here to smooth the Silox layer and aid in the subsequent metalization steps and it further causes a beneficial additional dopant diffusion into the contact sites. However, this step is not absolutely necessary and in fact may not be preferable in some cases.

The wafer is then subjected to an acid dip etch and then metalized as in the case of the previous embodiments.

Figure 18:
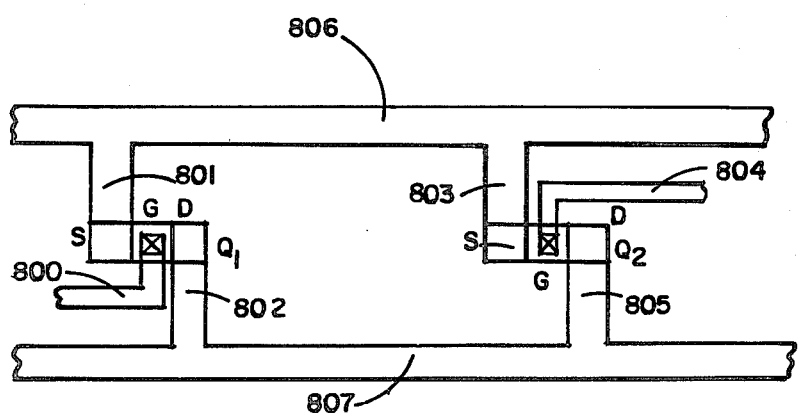
FIG. 18 illustrates an electrical intergrated circuit which may be a portion of a VLSI circuit.

FIG. 18 is a partial plan view of a portion of a semiconductor substrate containing elements fabricated in accordance with the present invention. Illustrated are field effect transistor devices $Q_1$ and $Q_2$ each having a source, gate and drain. Connected to the respective sources of transistors $Q_1$ and $Q_2$ are diffused N+ lines 801 and 803 which have been inter-connected by means of diffused N+ line 806. Similarly, the drains of transistors $Q_1$ and $Q_2$ are interconnected to each other by means of diffused N+ lines 802, 805, and 807. All of these diffused lines may be delineated simultaneously by means of the N-mask step. As illustrated in FIG. 18, diffused N+ lines 806 and 807 can extend in various directions on the substrate so as to interconnect with a plurality of additional devices. It is of course also possible to provide one or more contact regions to directly interconnect the N+ diffused lines 806 and 807 to the subsequent metalized interconnections delineated in the M-mask step.

The gates of transistors $Q_1$ and $Q_2$ are illustrated as being connected to polysilicon lines 800 and 804, respectively. These remote polysilicon lines could be connected to other portions of the circuitry contained on the substrate. In many cases, however, direct contact rather than a remote contact would be provided so as to directly connect the gates of the transistors to the metalized interconnections delineated by the M-mask step.

Figure 19:
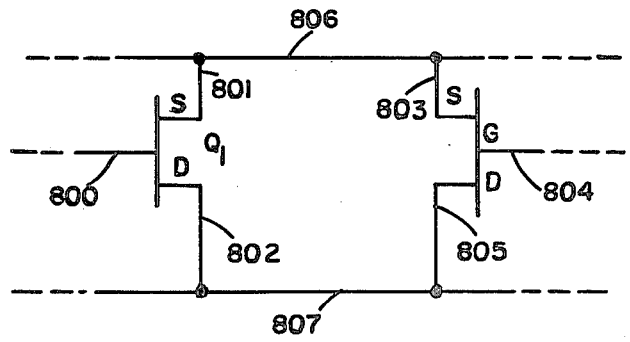
FIG. 19 is the equivalent electrical schematic of the structure of FIG. 18.

FIG. 19 schematically illustrates the portion of the substrate circuitry illustrated in FIG. 18. Like designators of the elements in FIG. 19 correspond to like elements in FIG. 18.

An important usage for the circuitry shown in FIGS. 18 and 19 would be in the fabrication of monolithic random access memories or read only memories having a large number of memory elements. As indicated in the Summary of the Invention, the disclosed fabrication process lends itself to the fabrication of circuits having active devices and associated interconnects having substantially reduced surface area in comparison to circuitry fabricated by prior art methods. Since there are inherent size limitations in the surface area of the silicon substrates contained in integrated circuit chips, the advantageous reduction in the overall surface area of the elements fabricated in accordance with the present invention allows for the production of integrated circuit chips having greater numbers of memory elements. For example, the invention renders it feasible to produce random access memory chips in accordance with the present invention having 256 kilobits of memory storage capability whereas present day prior art fabrication techniques have only been able to produce commercially feasible random access memory chips having 32 kilobits of memory storage capability.

Numerous modifications and variations of the process and device structures and configurations and of integrated circuit designs incorporating such devices will be apparent to those of skill in the art. Whereas N channel devices have been disclosed, it will be apparent that P channel devices instead can be made by this process. The processes have been illustrated as employing bulk silicon, but silicon layers on other substrates, such as silicon-on-sapphire, may be employed in the alternative.

These and other modifications and adaptations of the process and resulting structures and integrated circuits in accordance with this invention as disclosed herein will be apparent to those of skill in the art, and thus it is intended by the appending claims to cover all such modifications and adaptations wich fall within the true spirit and scope of the invention.

What is claimed is:

1. A process for fabricating on a layer of monocrystalline silicon a very large scale integrated circuit device, containing field effect transistors, polysilicon interconnect lines, and diffused interconnect lines, comprising the steps of:
1. oxidizing said silicon layer to form a first silicon dioxide layer on a surface thereon;
2. applying a first layer of silicon nitride over the surface of the first silicon dioxide layer;
3. selectively removing portions of said first silicon nitride layer, leaving portions of said first silicon nitride layer juxtaposed over areas wherein field effect transistors and diffused interconnect lines are to be formed;
4. oxidizing portions of said silicon layer to produce a very thick layer of silicon dioxide over said surface of the silicon except at those areas juxtaposed beneath the remaining portions of said first silicon nitride layer;
5. depositing a layer of polysilicon having dopant ions therein over said surface of the device;
6. oxidizing the surface of said polysilicon layer to form a second layer of silicon dioxide thereon;
7. applying a second layer of silicon nitride on top of the surface of the second silicon dioxide layer;
8. removing, by a selective removal process, all of said second nitride layer except for a region juxtaposed over the area in which a polysilicon interconnect line contact is to be formed;
9. applying a layer of silicon dioxide containing dopant ions therein over the surface of said device;
10. selectively removing all of the silicon dioxide layer containing dopant ions except at those regions juxtaposed over areas in which gates of the field effect transistors and the polysilicon interconnect lines are to be formed;
11. selectively removing the portions of said silicon nitride layers exposed by the removal of said silicon dioxide layer containing dopant ions;
12. selectively removing the exposed portions of any of said silicon dioxide layers exposed by the removal of said silicon nitride layers;
13. selectively removing the exposed portions of said polysilicon layer exposed by the removal of any of said silicon dioxide layers;
14. selectively removing all of the exposed portions of said silicon nitride layer except for those regions juxtaposed over areas to be formed into said field effect transistors and the contact of said diffused interconnect lines;
15. oxidizing said device whereby a additional layer of silicon dioxide is formed over said diffused interconnect lines and at least a portion of said polysilicon interconnect lines;
16. batch removing said silicon dioxide layer containing dopant ions;
17. removing said exposed silicon nitride layer exposed by the removal of said silicon dioxide layer containing dopant ions;
18. removing any of said remaining silicon dioxide layers from the areas wherein contact to the sources, gates, and drains of said field effect devices, the polysilicon interconnect line contact, and the diffused interconnect line contact are to be formed;
19. selectively applying conducting interconnection lines to said contact areas exposed by the removal of said remaining silicon dioxide layers.

2. A process as in claim 1, further comprising the following step to be performed prior to step 15:
doping said diffused interconnect lines except for the portions thereof juxtaposed beneath said contact area of said diffused interconnect lines.

3. A process as in claim 1, further comprising the following step to be performed prior to step 19:
simultaneously doping all of said exposed areas exposed by the removal of said remaining silicon dioxide layers.

4. A process as in claim 2, further comprising the following step to be performed prior to step 19:
simultaneously doping all of said exposed areas exposed by the removal of said remaining silicon dioxide layers.

5. A process as in claims 3 or 4, wherein said simultaneous doping step comprises the steps of:
applying a layer of material containing dopant ions;
heating said material to diffuse said dopant ions into said exposed regions.

6. A process as in claim 1, further comprising the following step to be performed prior to step 4:
ion implanting dopant ions into the surface of said silicon except for those areas wherein field effect transistors and diffused interconnect lines are to be formed.

7. A method of fabricating a very large scale integrated circuit including field effect transistor devices, first level interconnect lines, and diffused interconnect lines on a substrate comprising the steps of:
providing a monolithic monocrystalline silicon wafer to form the substrate of the integrated circuit;
forming a layer of silicon dioxide covering a first surface of said silicon wafer;
selectively applying a first oxidation mask layer covering said silicon dioxide layer in regions immediately juxtaposed the locations wherein field effect devices, first level interconnect lines, and diffused interconnect lines are to be formed, whereby said first oxidation mask layer is of a material which does not significantly oxidize at those temperatures which would oxidize silicon and wherein said first oxidation mask layer material remains substantially intact when exposed to a oxide removal process which removes oxides;
selectively doping the portions of the silicon substrate areas wherein said active devices and diffused interconnect lines are to be located;
oxidizing said silicon wafer to form a thick field oxide layer on those regions of said silicon dioxide layer not covered by said first oxidation mask layer;
selectively applying one of either a polycrystalline silicon containing dopant ions therein and a metal layer, wherein said one of said polycrystalline silicon and a metal layer is to be used in the formation of the gate electrodes and interconnect lines;
subjecting the wafer to an oxidation process for oxidizing said layer of one of either polycrystalline silicon and a metal layer;
selectively applying a second oxidation mask layer over an area including the region of said first level interconnect lines where an electrical connection is to be made;
selectively applying an insulating layer over the entire surface of the wafer except on those regions wherein said first level interconnect lines are located;
selectively removing the exposed portions of the first and second oxidation mask layers using a selective removal process which removes said oxidation mask layer material without substantially effecting the silicon or silicon dioxide materials;

selectively removing the exposed silicon dioxide layers using a selective removal process whereby said silicon dioxide layers are removed without substantially effecting said oxidation mask layer material;

selectively removing exposed portions of said one of either polycrystalline silicon or metal layer to delineate said first level interconnect lines using a selective removal process whereby said one of either polycrystalline silicon and metal layer is removed without substantially effecting the oxidation mask material or the silicon dioxide layer;

selectively removing the exposed portions of said first and second oxidation mask layers using a selective removal process whereby said first and second oxidation mask layers are removed without substantially effecting the silicon dioxide or one of said polycrystalline silicon or metal layers;

subjecting the wafer to an oxidation process whereby said exposed silicon and said one of either polycrystalline silicon or metal layers are oxidized;

selectively removing the exposed insulating layer using a selective removal process whereby said insulating layer is removed without materially removing the other layers on said wafer;

selectively removing the exposed first and second oxidation mask layers without materially effecting the remaining layers on the wafer;

doping portions of said wafer by providing dopant ions whereby at least said source, drain, and diffused interconnect line contact regions are doped;

providing electrical connections to said source, drain, first level interconnect, and diffused interconnect line contacts by means of the selective application of a conductive material.

8. A process in accordance with claim 7, wherein said first and second oxidation mask layers comprise silicon nitride layers.

9. A process in accordance with claim 8, wherein said insulating layer is comprised of chemically vapor deposited silicon dioxide having dopant ions therein.

10. A process in accordance with claim 8, wherein said selective removal processes comprise etching processes.

11. A process for forming very large scale integrated circuits on a monocrystalline silicon semiconductor substrate having field oxide regions surrounding and isolating at least a first selected area in which a field effect semiconductor device is to be formed and at least a second selected area in which a diffused conducting line is to be formed and having polysilicon line conductors disposed on said field oxide and for providing self-aligned contacts to at least selected ones of said conductors comprising the steps of:

thermally growing a first silicon dioxide layer on each of said first and second selected areas, forming a silicon nitride layer on said first silicon dioxide layer, forming a silicon oxynitride layer on said first silicon nitride layer, forming a polysilicon layer having dopant ions therein on said silicon oxynitride layer extending over said selected areas and said field oxide region, forming a protective button on said polysilicon layer, juxtaposed over the location of a corresponding said polysilicon line conductor to be formed, and of greater width than said line, applying a layer of silicon dioxide containing dopant ions therein on the exposed surface area, defining a polysilicon gate electrode extending transversely and centrally of said selected area for said active device, and a polysilicon line conductor, extending at least in part over said field region, of lesser width dimension than said button and intersecting same in an intersection region, to be formed from said polysilicon layer, removing portions of said button to conform the width of said button to that of said intersection region with said defined polysilicon line conductor, delineating said polysilicon layer including said layer of silicon dioxide containing dopant ions therein to form said line conductor with said conformed button juxtaposed thereon and to form said gate electrode, removing all of said silicon dioxide regions containing dopant ions except for that portion juxtaposed on said polysilicon layer, protecting the portions of said first silicon oxynitride and nitride layers on said source and drain regions and on a selected contact area of said diffused conducting line and removing all unprotected portions of said first silicon oxynitride and silicon nitride layers, removing the silicon dioxide layer portions exposed by removal of said first silicon nitride layer portions, forming a thermal oxide on exposed surfaces of said gate polysilicon layer, of said polysilicon line conductor, and of said diffused line, and removing said first silicon oxynitride and nitride layers from said source and drain regions and said diffused conducting line and removing said button, thereby to expose said contact surfaces of said source and drain regions, of said diffused conducting line and of said polysilicon line conductor.

12. A process as recited in claim 11 further comprising a step of providing conductor lines on said semiconductor substrate extending over said field oxide and onto said polysilicon line contact for providing electrical connection thereto.

13. A process as recited in claim 11 wherein said button comprises a silicon nitride layer, and said step of removing said button comprises applying a material to said substrate which selectively removes nitride and has no substantial effect on said insulating thermal oxide.

14. A process for forming very large scale integrated circuits on a monocrystalline silicon semiconductor substrate having field oxide regions surrounding and isolating at least a first selected area in which a field effect semiconductor device is to be formed and at least a second selected area in which a diffused conducting line is to be formed and having polysilicon line conductors disposed on said field oxide and for providing self-aligned contacts to at least selected ones of said conductors comprising the steps of:

thermally growing a first silicon dioxide layer on each of said first and second selected areas, forming a first silicon nitride layer on said first silicon dioxide layer, forming a silicon oxynitride layer on said first silicon nitride layer, forming a polysilicon layer having dopant ions therein on said silicon oxynitride layer extending over said selected areas and said field oxide region, forming a second silicon nitride layer on said polysilicon layer, retaining a selected portion of said second silicon nitride layer overlying said field region as a button having a width dimension larger than the width of a polysilicon line conductor to be formed from said polysilicon layer on said field region and removing remaining portions of said silicon nitride layer, defining a polysilicon gate electrode, extending transversly and centrally of said selected area for said active device, and a polysilicon line conductor, extending at least in part over said field region, of lesser width dimension than said button and intersecting same in an intersection region, to be formed from said polysilicon layer, removing portions of said second silicon oxynitride and silicon nitride layers of said button to conform the width of said button to that of said intersection region with said defined polysilicon line conductor, applying a layer of silicon dioxide containing dopant ions therein on the exposed surface areas, delineating said polysilicon layer including said layer of silicon dioxide containing dopant ions therein to form said line conductor with said conformed button juxtaposed thereon and to form said gate electrode, removing all of said silicon dioxide regions containing dopant ions except for that portion juxtaposed on said polysilicon layer, protecting the portions of said first silicon oxynitride and nitride layers on said source and drain regions and on a selected contact area of said diffused conducting line and removing all unprotected portions of said first silicon oxynitride and silicon nitride layers, removing the silicon dioxide layer portions exposed by removal of said first nitride layer portions, forming a thermal oxide on exposed surfaces of said gate polysilicon layer, of said polysilicon line conductor, and of said diffused line, and, in sequence, removing exposed portions of said first oxynitride layer and the thereby exposed portions of said first and second nitride layers, removing the exposed portions of said silicon dioxide layer exposed by removal of said portions of said first silicon nitride layer and any oxide on the exposed contact surface of said polysilicon line conductor, thereby to expose said contact surfaces of said source and drain regions, of said diffused conducting line, and of said polysilicon line conductor.

15. A process as recited in claim 11 or 14, further comprising the steps of:

performing a first diffusion doping into the exposed surfaces of said diffused conducting line prior to the step of forming a thermal oxide thereon, and performing a second diffusion doping into the exposed surfaces of said source and drain regions and of said diffused conducting line.

16. A process for fabricating a field effect semiconductor device having source, drain, and gate regions on a selected area of a first surface of a monocrystalline silicon substrate comprising the steps of:

thermally growing a silicon dioxide layer on said selected area of said first surface of a thickness suitable for the gate insulator layer of said field effect device, forming a first silicon nitride layer on said silicon dioxide layer, forming a first silicon oxynitride layer on said first silicon nitride layer, forming a polysilicon layer having dopant ions therein on said first silicon oxynitride layer, forming a second silicon nitride layer on said polysilicon layer, removing said second nitride layer except for retaining a gate contact surface defining portion thereof extending transversly of said selected area in the region of a gate to be defined, applying a layer of silicon dioxide containing dopant ions therein on the exposed surface areas, protecting said retained portion of said second silicon nitride layer while delineating said polysilicon layer to define a gate polysilicon layer electrode extending transversely of said selected area of said active device of greater width than and in alignment with said retained portion of said second silicon nitride layer, said gate polysilicon layer electrode defining first and second remaining portions of said selected area corresponding to source and drain regions of said device, removing all of said silicon dioxide regions containing dopant ions except for that portion juxtaposed said polysilicon layer, thermally oxidizing the surface of said gate polysilicon layer electrode while retaining said first silicon nitride and silicon oxynitride layers over said source and drain regions of said active device to prevent formation of any substantial amount of oxide thereon, removing said retained portion from said gate polysilicon layer electrode and simultaneously removing the portions of said first silicon oxynitride layer from said source and drain regions, removing said retained second nitride layer portion from said gate polysilicon layer electrode and simultaneously removing the portions of said first nitride layer portions from said source and drain regions, and removing any silicon dioxide from said gate polysilicon electrode exposed by removal of said second silicon nitride portions therefrom, to expose the underlying contact surface of said gate polysilicon layer electrode defined thereby, and simultaneously removing said silicon dioxide layer from said source and drain region sources, thereby to provide a direct contact to said gate polysilicon layer eletrode.

17. A process for fabricating a field effect semiconductor device having source, drain, and gate regions on a selected area of a first surface of a monocrystalline silicon substrate comprising the steps of:

thermally growing a silicon dioxide layer on said selected area of said first surface of a thickness suitable for the gate insulator layer of said field effect device, forming a first silicon nitride layer on said silicon dioxide layer, forming a first silicon oxynitride layer on said first silicon nitride layer, forming a polysilicon layer having dopant ions therein on said first silicon oxynitride layer, forming a protection layer on said polysilicon layer, said protection layer being substantially non-oxidizable by thermal oxidation and being removable by a material-selective removal process having no substantial effect on silicon and silicon dioxide surfaces, removing said protection layer except for retaining a gate contact surface defining portion thereof extending transversly of said selected area in the region of a gate to be defined, applying a layer of silicon dioxide having dopant ions therein on the exposed surface areas, protecting said retained portion of said protection layer while delineating said polysilicon layer to define a gate polysilicon layer electrode extending transversly of said selected area of said active device of greater width than and in alignment with said retained portion of said protection layer, said gate polysilicon layer electrode defining first and second remaining portions of said selected area corresponding to source and drain regions of said device, removing all of said silicon dioxide regions containing dopant ions except for that portion juxtaposed on said polysilicon layer, thermally oxidizing the surface of said gate polysilicon layer electrode while retaining said first silicon nitride and silicon oxynitride layers over said source and drain regions of said active device to prevent formation of any substantial amount of oxide thereon, removing said retained, protection layer portion from said gate polysilicon layer electrode and removing said first silicon oxynitride and silicon nitride layers from said source and drain regions, and removing any silicon dioxide from said gate polysilicon electrode exposed by removal of said protection layer portion therefrom, to expose the underlying contact surface of said gate polysilicon layer electrode defined by said protection layer portion, and simultaneously removing said silicon dioxide layer from said source and drain region sources, thereby to provide a direct contact to said gate polysilicon layer electrode.

18. A process for forming a self-aligned contact with polysilicon line conductor to be formed at least in part on the field oxide of a semiconductor substrate, comprising:

forming a polysilicon layer having dopant ions therein on said substrate extending at least over said field oxide, forming a protective button on said polysilicon layer, juxtaposed on the location of a corresponding said polysilicon line conductor to be formed, and of greater width than said line conductor, applying a layer of silicon dioxide having dopant ions therein on the exposed surface areas, defining said polysilicon line conductor, delineating said button to conform in width and location to said defined line conductor, delineating said polysilicon layer to form said line conductor with said conformed button juxtaposed thereon, and to form said gate electrode, removing all of said silicon dioxide regions having dopant ions except for that portion juxtaposed on said polysilicon layer, thermally oxidizing said polysilicon line to form an insulating oxide layer thereon while said button prevents thermal oxidation of the line conductor portion on which it is juxtaposed, and removing said button by a selective material removal process which does not affect said insulating thermal oxide, thereby to expose the underlying surface portion of said polysilicon line conductor as a contact.

19. A process as recited in claim 18, further comprising a step of providing conductor lines on said semiconductor substrate extending over said field oxide and onto said polysilicon line contact for providing electrical connection thereto.

20. A process as recited in claim 18, wherein said button comprises a silicon nitride layer, and said step of removing said button comprises applying a material to said substrate which selectively removes nitride and has no substantial affect on said insulating thermal oxide.

21. A process for forming very large scale integrated circuits on a monocrystalline silicon semiconductor substrate having field oxide surrounding and isolating at least one selected area in which a field effect semiconductor device is to be formed and having at least one polysilicon line conductor disposed at least in part on said field oxide and for providing self-aligned contacts to at least the source and drain regions of said device and to said polysilicon line conductor at a selected location thereof, comprising the steps of:

thermally oxidizing the surface of said semiconductor substrate in said selected area to form a first silicon dioxide layer thereon, forming a first silicon nitride layer on said first silicon dioxide layer, forming a first silicon oxynitride layer on said first silicon nitride layer, forming a layer of polysilicon having dopant ions therein on said first silicon oxynitride layer and on said field oxide, applying a layer of silicon dioxide containing dopant ions therein on the exposed surface areas, forming a protective button on said polysilicon layer, juxtaposed over the location of the corresponding said polysilicon line conductor to be formed, and of greater width and said line conductor, defining a polysilicon line conductor to be formed from said polysilicon layer in accordance with the said juxtaposed position of said button and defining a polysilicon gate electrode to be formed in said polysilicon layer, said gate electrode extending transversely and centrally of said selected area for said active device, delineating said button to conform in width and location to that of said line, delineating said polysilicon layer to provide said polysilicon line conductor and said polysilicon gate electrode, removing all of said silicon dioxide regions containing dopant ions except for that portion juxtaposed on said polysilicon layer, thermally oxidizing said polysilicon line conductor and said polysilicon gate electrode to form an insulating oxide on exposed surfaces thereof while said button prevents thermal oxidation of the line portion on which it is juxtaposed and said first silicon nitride and oxynitride layer prevent thermal oxidation of said source and drain regions, removing said button and said first silicon oxynitride and nitride layers overlying said source and drain regions of said device, removing the silicon dioxide layer portions exposed by removal of said first silicon oxynitride and nitride layers and removing any oxide on the surface of said polysilicon line conductor exposed by removal of said button, thereby to expose said contact surfaces of said source and drain regions and of said polysilicon conducting line.

22. A process as recited in claim 21 further comprising a step of providing conductor lines on said semiconductor substrate extending over said field oxide and onto said polysilicon line contact for providing electrical connection thereto.

23. A process as recited in claim 21 wherein said button comprises a silicon nitride layer, and said step of removing said button comprises applying a material to said substrate which selectively removes nitride and has no substantial affect on said insulating thermal oxide.

24. A very large scale integrated circuit produced in accordance with the process claimed in claims 1, 7, 11, 14 or 21.

25. A field effect transistor produced in accordance with the process claimed in claims 16 or 17.

26. A self-aligned contact with polysilicon line conductors in accordance with the process claimed in claim 18.

* * * * *